(12) United States Patent
Chen et al.

(10) Patent No.: US 8,883,541 B2
(45) Date of Patent: Nov. 11, 2014

(54) SELF-POWERED INTEGRATED CIRCUIT WITH MULTI-JUNCTION PHOTOVOLTAIC CELL

(71) Applicant: Texas Instruments Incorporated, Dallas, TX (US)

(72) Inventors: Yuanning Chen, Plano, TX (US); Thomas P. Conroy, Dallas, TX (US); Jeffrey R. DeBord, Dallas, TX (US); Nagarajan Sridhar, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 13/936,640

(22) Filed: Jul. 8, 2013

(65) Prior Publication Data

US 2013/0295711 A1  Nov. 7, 2013

Related U.S. Application Data

(60) Division of application No. 13/220,227, filed on Aug. 29, 2011, now Pat. No. 8,552,470, which is a continuation-in-part of application No. 13/218,340, filed on Aug. 25, 2011.

(60) Provisional application No. 61/377,717, filed on Aug. 27, 2010, provisional application No. 61/377,063, filed on Aug. 25, 2010.

(51) Int. Cl.
| | | |
|---|---|---|
| H01L 21/00 | (2006.01) | |
| H01L 29/165 | (2006.01) | |
| H01L 31/18 | (2006.01) | |
| H01L 31/0687 | (2012.01) | |
| H01L 31/0288 | (2006.01) | |
| H01L 23/48 | (2006.01) | |
| H01L 21/265 | (2006.01) | |

(52) U.S. Cl.
CPC .......... *H01L 31/1804* (2013.01); *H01L 29/165* (2013.01); *H01L 31/0687* (2013.01); *H01L 31/1812* (2013.01); *H01L 31/0288* (2013.01); *H01L 23/481* (2013.01); *Y02E 10/547* (2013.01); *Y02E 10/544* (2013.01); *H01L 21/26506* (2013.01)
USPC ...... 438/59; 438/406; 257/506; 257/E21.134; 257/E21.546; 257/E29.006

(58) Field of Classification Search
None
See application file for complete search history.

(56) References Cited

U.S. PATENT DOCUMENTS

| | | |
|---|---|---|
| 6,455,766 B1 | 9/2002 | Cook et al. |
| 7,098,394 B2 | 8/2006 | Armer et al. |
| 2009/0206420 A1 | 8/2009 | Stecher et al. |

OTHER PUBLICATIONS

Plesz, B. et al., "Feasibility Study of a CMOS-Compatible Integrated Solar Photovoltaic Cell Array", DTIP, Seville, , Spain, May 5-7, 2010.
Fish, Alexander et al., "CMOS Image Sensors with Self-Powered Generation Capability", IEEE Transaction on Circuits and Systems, vol. 53, No. 11, pp. 1210-1214, Nov. 2006.

*Primary Examiner* — Yasser A Abdelaziez
(74) *Attorney, Agent, or Firm* — Jacqueline J. Garner; Frederick J. Telecky, Jr.

(57) ABSTRACT

A photovoltaic cell is provided as a composite unit together with elements of an integrated circuit on a common substrate. In a described embodiment, connections are established between a multiple photovoltaic cell portion and a circuitry portion of an integrated structure to enable self-powering of the circuitry portion by the multiple photovoltaic cell portion.

4 Claims, 2 Drawing Sheets

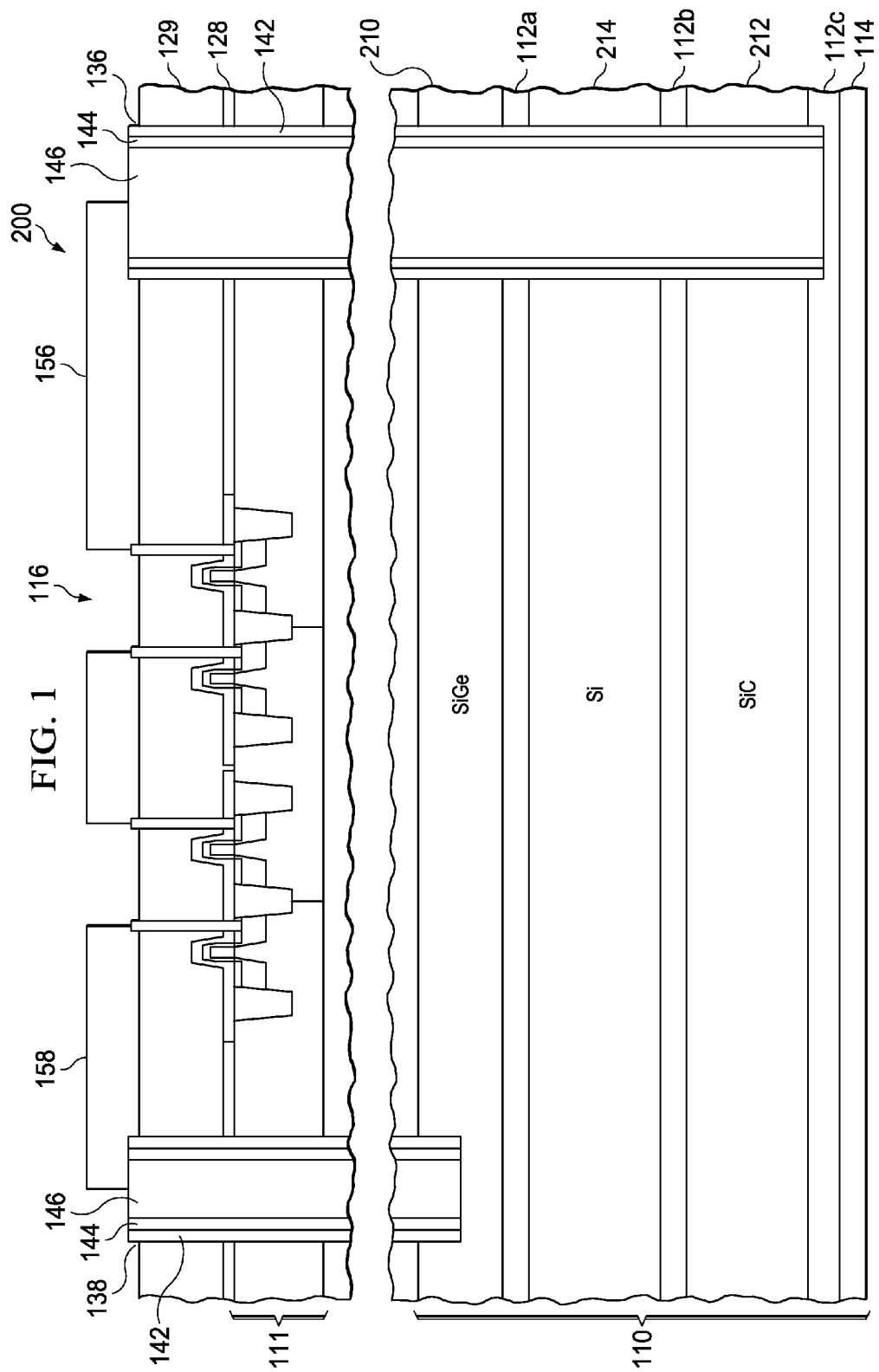

FIG. 2a
FIG. 2b
FIG. 2c
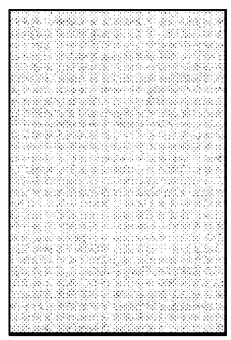
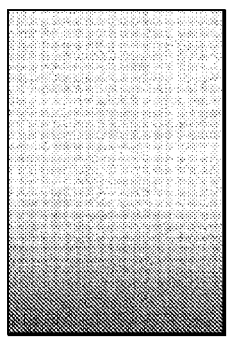
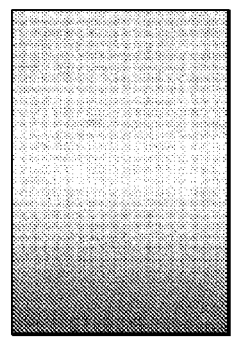
SUBSTRATE: Si
IMPLANTATION OF Ge
IMPLANTATION OF C
← SiC
← Si
← SiGe
FIG. 3
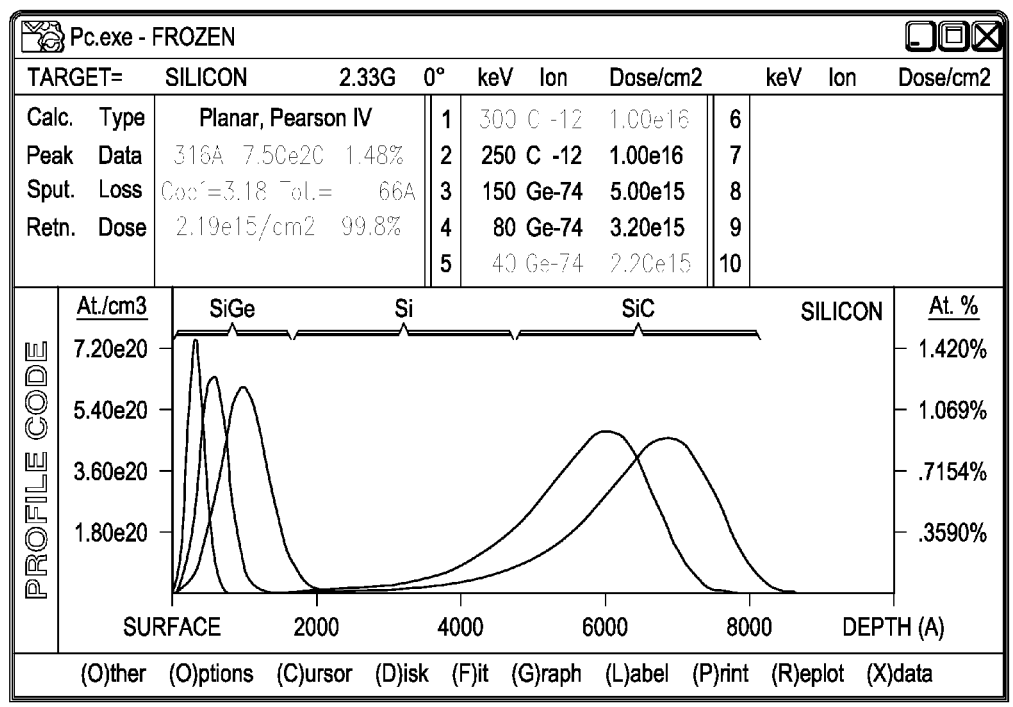

SELF-POWERED INTEGRATED CIRCUIT WITH MULTI-JUNCTION PHOTOVOLTAIC CELL

This application is a division of application Ser. No. 13/220,227 filed Aug. 29, 2011, which claims the benefit of Provisional Application No. 61/377,717 filed Aug. 27, 2010; and is a continuation-in-part of application Ser. No. 13/218,340 filed Aug. 25, 2011, which claims the benefit of Provisional Application No. 61/377,063 filed Aug. 25, 2010; the entireties of all of which are hereby incorporated by reference.

This relates to integrated circuits and methods for their fabrication. This also relates to photovoltaic (solar) cells.

BACKGROUND

There is a growing interest in new and better ways to economically and efficiently harvest ambient energy to power electronic devices using photovoltaic, piezoelectric, electrodynamic, thermoelectric and other power generating technologies as replacements for or in augmentation of batteries and other conventional power sources.

There is also a growing interest in the development of sensing elements for wide deployment of sensing elements at scattered locations, such as in industrial wireless sensor networks (WSNs) and the like, for remotely determining the status of environmental and other local conditions (temperature, pressure, flow rate, fill level, chemical presence, biological conditions, etc.), under circumstances requiring dependable portable power sources but where batteries or battery power alone may not be adequate.

SUMMARY

A photovoltaic cell is provided as a composite unit together with elements of an integrated circuit on a common substrate. In a described embodiment, connections are established between a multiple photovoltaic cell portion and a circuitry portion of an integrated structure to enable self-powering of the circuitry portion by the photovoltaic cell portion.

BRIEF DESCRIPTION OF THE DRAWINGS

FIG. 1 is a simplified cross-sectional view of an integrated circuit device fabricated in accordance with principles of the invention.

FIGS. 2A-2C are schematic views showing implantation steps.

FIG. 3 is a graphical presentation of example implantation parameters.

DETAILED DESCRIPTION OF EXAMPLE EMBODIMENTS

Example implementations of the invention are described with reference to the structure and fabrication of the integrated circuit device 200 illustrated in FIG. 1, and with reference to parent application U.S. application Ser. No. 13/218,340, filed Aug. 25, 2011 (the "parent application"), the entirety of which is incorporated herein by reference.

As with the device 100 described and shown in the parent application, the device 200 may comprise a substrate 110 in the form of a semiconductor wafer which may, e.g., be a standard 200 mm or 300 mm silicon wafer having a thickness of about 675 microns and a p-type bulk conductivity. An epitaxial layer 111 of semiconductor material of, e.g., 3 micron thickness of silicon may be formed on a front surface thereof. And, also like the device 100 of the parent application, the device 200 is fabricated to include a pn junction photovoltaic cell portion with an anti-reflective coating 114 on a back side thereof, transistors and/or other circuit devices 116 formed in or on the epitaxial layer 111 on a front side thereof, and contacts 146 establishing electrical connections between the photovoltaic cell portion and the circuit elements 116 to enable the photovoltaic cell portion to function as a primary or auxiliary power source for the circuit elements 116. In contrast to the device 100 illustrated in the parent application, however, the photovoltaic cell portion of device 200 is fabricated to provide multiple pn junctions of respective different energy absorbing bandwidths in order to improve efficiency of operation.

In one advantageous embodiment of device 200, the different junctions are provided using materials readily available in the fabrication of integrated circuits, such as using advanced CMOS semiconductor fabrication processes. An implantation may, for example, be made into the back side of the bulk silicon of the wafer shown in FIG. 2A to implant germanium atoms to provide a region 210 of silicon germanium material as shown in FIG. 2B at a first depth into the wafer from the back surface. Another implantation may, for example, also be made into the back side of the bulk silicon of the wafer to implant carbon atoms to provide a region 212 of silicon carbon material as shown in FIG. 2C at a second depth into the wafer from the back surface. The implantation parameters may be chosen to suit individual needs and preferences. Example parameters for germanium and carbon implantations are given in the simulation run profiles shown in FIG. 3, and are shown in the table below (the order of listing in the table corresponds to the order of peaks from right to left in FIG. 3).

| Implant Energy (keV) | Ion | Dose/cm$^2$ |
|---|---|---|
| 300 | C-12 | 1.00e16 |
| 250 | C-12 | 1.00e16 |
| 150 | Ge-74 | 5.00e15 |
| 80 | Ge-74 | 3.20e15 |
| 40 | Ge-74 | 2.20e15 |

As shown in FIGS. 1-3, implantation parameters can be chosen to provide a peak concentration of carbon in a region 212 close to the back surface and a peak concentration of germanium in a region 210 at a first depth of about 1 micron or so from the back surface. This defines an intermediate region 214 of the bulk silicon at a second depth between the surface region 212 and the first depth region 210. Counter-doping, e.g., with n-type dopant into the p-type bulk of the wafer may then be applied to form heavily doped (viz., n+) n-type regions 112a, 112b, 112c within a back portion (closer to the back side of the wafer) of each of the silicon germanium, silicon and silicon carbide regions 210, 214, 212, to provide (in the illustrated example) three pn junctions in series at the back side of the wafer.

Normally, the implantations done to form the multiple pn junctions will be done prior to formation of the anti-reflective coating 114 and prior to the fabrication of the devices 116. Though the use of germanium and carbon may be convenient because of the ready availability of those materials in CMOS integrated circuit fabrication, the materials used to provide the different pn junctions may be varied to suit individual needs and preferences. Likewise, the number of pn junctions provided may be varied to suit individual needs and preferences. For example, although three pn junctions are shown defined by the germanium and carbon implantations, other implementations may use a subset of the same materials to form just two junctions (e.g., any two of silicon germanium, silicon and silicon carbon). Moreover, the same and/or different materials may be used to provide more than three pn junctions. It is noted in the illustrated device 200 that the largest bandgap material is preferably placed closest to the back surface so as not to block the passage of photons through to the next material (viz., the bandgap for silicon carbon is around 6, for silicon around 1.2, and for silicon germanium around 0.6).

After formation of the multiple pn junctions of the photovoltaic cell near the back surface of the wafer, the protective coating including anti-reflective layer 114 may be formed over the back surface, followed by formation of the transistors and/or other circuit devices 116 in or on the epitaxial layer 111 using, e.g., typical advanced CMOS integrated circuit fabrication processes as described in the parent application for the device 100.

As with device 100, electrical connections for the pn junctions of the photovoltaic cell of the device 200 are illustrated as established through the epitaxial layer 111 from the front side of the wafer, not through the n-type region 112c at the back side of the wafer 110. As with device 100, the illustrated contacts may take the form of one or more deep silicon vias (DSVs). One of more via openings 136, 138 may be formed through the pre-metal layer and/or through one or more inter-level dielectric layers 129 from the front surface down to the top of the upper region 210 and bottom of the lower region 212 to form electrical connection respectively to each of the sides of the multiple pn junction photovoltaic cell portion of the device 200. For the serial multiple pn junction arrangement illustrated in FIG. 1, a first via opening 136 extends through the epitaxial layer 111 down to the heavily doped n-type region 112c, and a second via opening 138 extends through the epitaxial layer 111 down to the upper portion of the silicon germanium region 210, above the heavily doped n-type region 112a. As with the corresponding via openings of device 100, for example, the via openings 136, 138 may be single vias of generally circular cross section with their respective relative diameters chosen to enable simultaneous etching down to their respective desired different depths. The sides of etched openings 136, 138 may be lined with an insulator such as a titanium nitride liner 142, with the bases of the lined openings then etched to enable electrical contact with the underlying portions of regions 210 and 212. The open bottom insulator lined openings may then be filled with a conductive material, such as by first depositing a copper seed layer 144 therein, and then filling the remainder of the opening with a copper fill metal 146. As for the device 100, the number and locations of openings 136, 138 in the device 200 and their cross section configurations may be selected to suit individual needs and preferences.

In the shown arrangement, the filled openings 136, 138 provide respective electrical connections to the upper part of the top region 210 and bottom part of the bottom region 212, thereby connecting the pn junctions in series. If a parallel arrangement is wanted, however, additional contacts may be similarly established to provide respective connections to the upper and lower parts of each separate region 210, 214 and 212.

As described in connection with device 100, connections 156, 158 (shown schematically in FIG. 1) may be formed together with formation of the dielectric and metal interconnect layers of the integrated circuit elements 166 to connect the filled openings 136, 138 with contacts of the elements 116 to establish electrical connection of the photovoltaic cell portion and the integrated circuit device portion of the device 200, so that voltage developed across the multiple pn junctions can serve as a power source for the devices 116 when the device 200 is mounted within a package so that the back side is exposed to illumination.

The layered SiGe, Si, SiC arrangement shown in FIG. 1 may also be achieved by other processes. For example, one or more of the layers may be separately deposited using laser assisted or other short term, high temperature anneal processes to promote uniformity in atom distribution and stress. Such an approach might, e.g., deposit a silicon layer epitaxially over a previously deposited SiGe layer or Ge doped Si substrate region, and then either deposit a SiC layer (C added in situ during deposition) over the epitaxial Si layer, or dope an outer region of the epitaxial Si layer with C atoms. The use of a laser assisted anneal enables annealing without exceeding the permissible thermal budget for the circuitry 116 or other more heat sensitive portions of the device.

It will be appreciated that the described multiple pn junction configuration can also be integrated together with devices formed using other approaches as described in the parent application. For example, in the carrier wafer approach to integrating a photovoltaic cell with circuitry on a same IC chip described with respect to FIGS. 2A-2C in the parent application, the multiple pn junctions may be added following the fabrication of the circuit devices 116 and contacts 130, 138/146 and bonding of the inverted wafer 110 to the carrier wafer 210, as shown in FIG. 2B of the parent application. This can be done by forming the SiGe, Si and SiC layers using implantations into one of more layers of material on the reduced thickness back of the wafer 110, or using in situ depositions of Ge and or C together with the deposition of one or more Si layers on the back of wafer 110. The formation of the n-type and p-type regions for each pn junction may then proceed as previously described, with by implantation or in situ deposition of one or more layers. Electrical contacts to the uppermost and lowermost doped regions of multiple pn junction structures can be made as described for the upper and lower doped regions of the pn junction of the device 100 as shown in FIGS. 2A-2C and 3 of the parent application.

Those skilled in the art to which the invention relates will appreciate that other embodiments and variations of embodiments are possible within the scope of the claimed invention.

What is claimed is:

1. A method of forming an integrated circuit and photovoltaic cell, comprising:

doping an upper region of a front side of a first wafer of given conductivity type with dopant of both the given and opposite conductivity types to form well regions and source/drain regions of PMOS and NMOS transistors;

forming first and second contacts for the PMOS and NMOS transistors;

forming one or more dielectric layers over the well regions, source/drain regions and first and second contacts;

forming first and second interconnects to establish respective electrical connections between the first and second contacts and an upper part of the one or more dielectric layers;

bonding the first wafer at the upper part of the one or more dielectric layers to a second wafer;

forming a region silicon germanium material at a first depth, a region of silicon carbon material at a second depth, and a region of silicon material substantially free of germanium or carbon atoms between the first and second depths over a back side of the first wafer; and forming regions of opposite conductivity type defining first doped regions of respective pn junctions in series of a photovoltaic cell in each of the regions of silicon germanium, silicon and silicon carbon material, with a second doped region of each of the pn junctions in series being at least partially defined by a second doped region of the given conductivity type of the wafer; and forming first and second contacts for establishing respective electrical connections between uppermost and lowermost ones of the regions of given and opposite conductivity types of the pn junctions and the first and second interconnects.

2. The method of claim 1, wherein forming at least one of the first and second contacts for establishing electrical connections between the pn junction regions and the first and second interconnects includes forming a via contact from a location at a bottom part of the upper region to the upper part of the one or more dielectric layers.

3. The method of claim 2, wherein the via contact is formed prior to the bonding.

4. The method of claim 1, wherein forming at least one of the first and second contacts for establishing electrical connections between the pn junction regions and the first and second interconnects includes forming a wraparound contact that wraps around sides of the first wafer.

* * * * *